United States Patent
Horie et al.

(10) Patent No.: US 9,261,669 B2
(45) Date of Patent: Feb. 16, 2016

(54) VIBRATING ELEMENT HAVING MEANDERING SHAPE, AND OPTICAL REFLECTION ELEMENT

(75) Inventors: Toshiaki Horie, Osaka (JP); Shinsuke Nakazono, Osaka (JP); Soichiro Hiraoka, Hyogo (JP); Yuta Yamamoto, Osaka (JP); Kazuki Komaki, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 272 days.

(21) Appl. No.: 13/978,386

(22) PCT Filed: Feb. 16, 2012

(86) PCT No.: PCT/JP2012/001015
§ 371 (c)(1),
(2), (4) Date: Jul. 3, 2013

(87) PCT Pub. No.: WO2012/111332
PCT Pub. Date: Aug. 23, 2012

(65) Prior Publication Data
US 2013/0271804 A1    Oct. 17, 2013

(30) Foreign Application Priority Data
Feb. 17, 2011 (JP) .................................. 2011-031586

(51) Int. Cl.
G02B 26/10 (2006.01)
G02B 7/182 (2006.01)
G02B 26/08 (2006.01)
H02N 2/10 (2006.01)
B81B 3/00 (2006.01)
H01L 41/08 (2006.01)
H01L 41/09 (2006.01)

(52) U.S. Cl.
CPC .............. *G02B 7/1821* (2013.01); *B81B 3/007* (2013.01); *B81B 3/0043* (2013.01);
(Continued)

(58) Field of Classification Search
CPC .............. G02B 7/1821; G02B 26/0858; G02B 26/105; G02B 26/101; H01L 41/0953; H01L 41/0805; B81B 3/0043; B81B 3/007; B81B 2203/0163; B81B 2203/0109; H02N 2/10; H02N 2/108
See application file for complete search history.

(56) References Cited

U.S. PATENT DOCUMENTS

| 2010/0245966 A1 | 9/2010 | Yasuda |
| 2011/0032590 A1* | 2/2011 | Terada ................ H01L 41/0953 359/199.4 |
| 2012/0007477 A1* | 1/2012 | Takahashi et al. ............ 310/366 |

FOREIGN PATENT DOCUMENTS

| JP | 2008-040240 | 2/2008 |
| JP | 2010-237492 | 10/2010 |
| JP | 2010-263736 | 11/2010 |

(Continued)

OTHER PUBLICATIONS

International Search Report issued in International Application No. PCT/JP2012/001015 with date of mailing May 22, 2012.

*Primary Examiner* — Thomas K Pham
*Assistant Examiner* — Cara Rakowski
(74) *Attorney, Agent, or Firm* — McDermott Will & Emery LLP (57) ABSTRACT

A vibrating element having a meandering shape includes a vibrating beam and a piezoelectric actuator provided on the vibrating beam. The vibrating beam has a meandering-shape substantially formed into the plurality of continuous turned-down shapes. The vibrating beam includes the plurality of turned-down units and the plurality of coupling units coupled to the turned-down units, and the coupling units and the turned-down units are alternately disposed. The piezoelectric actuator includes a lower electrode provided on the vibrating beam, a piezoelectric film provided on the lower electrode, and an upper electrode provided on the piezoelectric film. A non-existence region where the piezoelectric film does not exist is provided in at least one of a neighborhood of a midpoint of an inner circumference of each of the turned-down units and a neighborhood of a curvature changing point in which a curvature of the inner circumference of each of the turned-down shapes changes.

14 Claims, 8 Drawing Sheets

(52) U.S. Cl.
CPC ......... *G02B 26/0858* (2013.01); *G02B 26/101* (2013.01); *G02B 26/105* (2013.01); *H01L 41/081* (2013.01); *H01L 41/0953* (2013.01); *H02N 2/10* (2013.01); *H02N 2/108* (2013.01); *B81B 2203/0109* (2013.01); *B81B 2203/0163* (2013.01)

(56) References Cited

FOREIGN PATENT DOCUMENTS

| | | | |
|---|---|---|---|
| WO | WO 2010122950 A1 * | 10/2010 | ............ H01L 41/047 |
| WO | WO 2010/131556 | 11/2010 | |

* cited by examiner

VIBRATING ELEMENT HAVING MEANDERING SHAPE, AND OPTICAL REFLECTION ELEMENT

RELATED APPLICATIONS

This application is the U.S. National Phase under 35 U.S.C. §371 of International Application No. PCT/JP2012/001015, filed on Feb. 16, 2012, which in turn claims the benefit of Japanese Application No. 2011-031586, filed on Feb. 17, 2011, the disclosures of which Applications are incorporated by reference herein.

BACKGROUND

1. Technical Field

The present invention relates to a vibrating element having a meandering shape, which is used in various piezoelectric actuators and an optical reflection element.

2. Background Art

Figure 9:
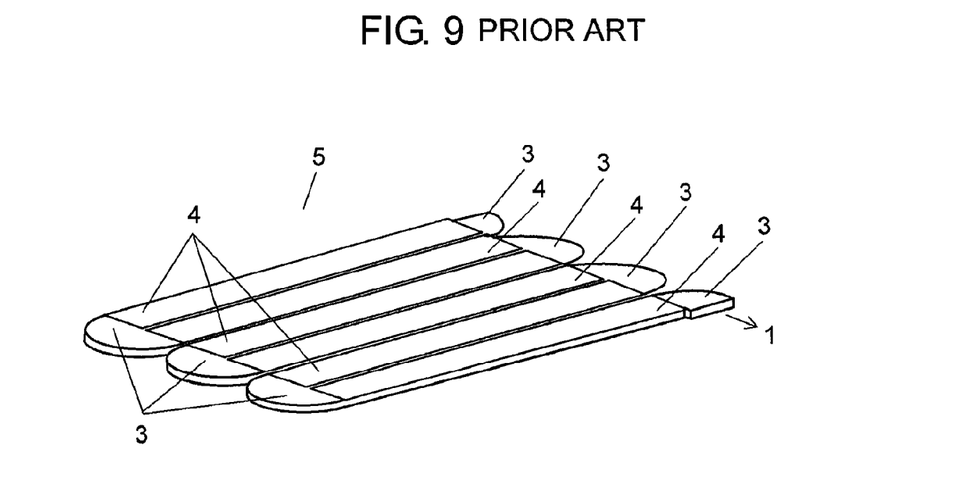
FIG. 9 is a perspective view of a conventional piezoelectric actuator.

Conventionally, what is called a meandering-shape piezoelectric actuator in which a beam connected to and supported by a fixed unit is turned down plural times is known. FIG. 9 is a perspective view of conventional piezoelectric actuator 5. In FIG. 9, piezoelectric actuator 5 has a meandering shape, and is formed in an upper portion of the beam. The beam is configured by a plurality of turned-down units 3 and a plurality of coupling units 4 each of which is coupled to turned-down units 3. Piezoelectric actuator 5 includes an insulating film, a lower electrode, a piezoelectric film, and an upper electrode. The lower electrode is provided on the insulating film. The piezoelectric film is provided on the lower electrode. The upper electrode is provided on the piezoelectric film. A voltage is applied to the plurality of upper electrodes such that the upper electrodes become opposite phases to each other, thereby driving a plurality of piezoelectric material layers.

Figure 10:
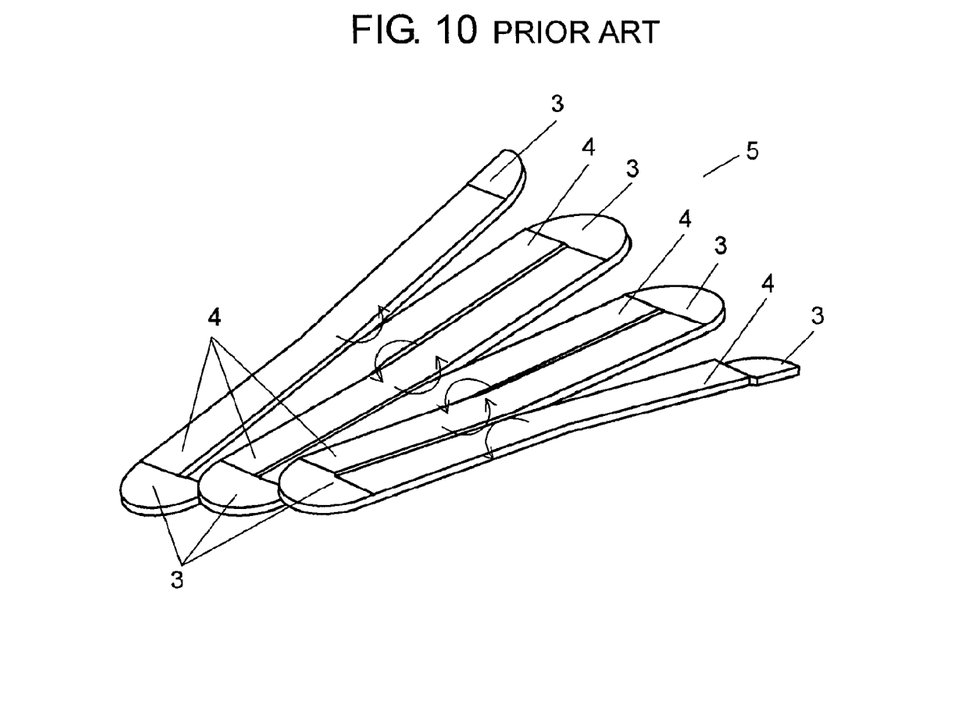
FIG. 10 is a perspective view illustrating an operation of the conventional piezoelectric actuator.

FIG. 10 is a perspective view illustrating an operation of conventional piezoelectric actuator 5. As illustrated in FIG. 10, the plurality of piezoelectric material layers are driven to displace the plurality of coupling units 4 in arrow directions, thereby warping coupling units 4. In piezoelectric actuator 5, the large displacement at one end of the meandering shape is obtained by adding displacement amounts of the plurality of coupling units 4. For example, an optical reflection element that scans with a laser beam uses the displacement as described above.

For example, PTL 1 discloses the conventional piezoelectric actuator.

CITATION LIST

Patent Literature

PTL 1: Unexamined Japanese Patent Publication No. 2008-040240

SUMMARY

A vibrating element having a meandering shape includes a vibrating beam and a piezoelectric actuator that is provided on the vibrating beam. The vibrating beam includes a plurality of turned-down units and a plurality of coupling units, and has a meandering shape substantially configured by a plurality of continuous turned-down shapes. That is, the plurality of turned-down units and the plurality of coupling units are alternately disposed to form the meandering shape. The piezoelectric actuator includes a lower electrode that is provided on the vibrating beam, a piezoelectric film that is provided on the lower electrode, and an upper electrode that is provided on the piezoelectric film. A non-existence region where the piezoelectric film does not exist is provided in at least one of a midpoint of an inner circumference of each of the plurality of turned-down units and a neighborhood of the midpoint, and a curvature changing point in which a curvature of the inner circumference of each of the plurality of turned-down shapes changes and a neighborhood of the curvature changing point.

The vibrating element having the meandering shape can obtain the large displacement.

DESCRIPTION OF EMBODIMENTS

First Exemplary Embodiment

Vibrating element having a meandering shape 10 according to a first embodiment will be described with reference to the drawings.

Figure 1A:
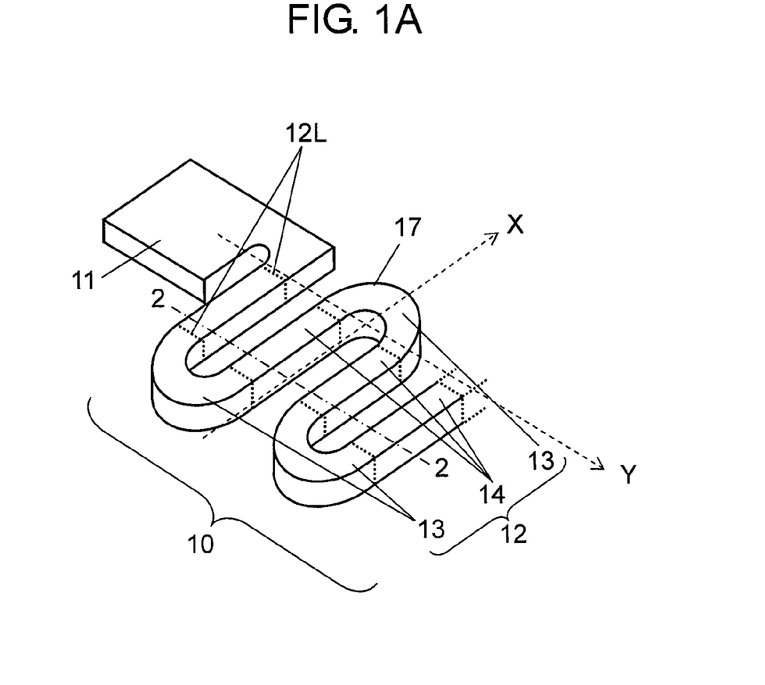
FIG. 1A is a perspective view of a vibrating element having a meandering shape according to a first embodiment.

FIG. 1A is a perspective view of vibrating element having the meandering shape 10 of the first embodiment. In the first embodiment, a direction in which the meandering shape goes on is referred to as a Y-axis direction, and a direction orthogonal to the Y-axis direction is referred to as an X-axis direction. One end of vibrating element having the meandering shape 10 is connected to and supported by fixed unit 11. Vibrating element having the meandering shape 10 includes meandering-shape vibrating beam 12 that is substantially configured by the plurality of continuous turned-down shapes, and piezoelectric actuator 17. Piezoelectric actuator 17 is provided on vibrating beam 12 into the meandering shape. Vibrating beam 12 is integrally configured by a plurality of turned-down units 13 and a plurality of coupling units 14. The plurality of coupling units 14 are coupled to the plurality of turned-down units 13 with being alternately disposed to one another. That is, turned-down unit 13 and the plurality of coupling units 14 adjacent to turned-down unit 13 constitute the turned-down shape. Coupling unit 14 is a linear part of vibrating beam 12, and sandwiched between dotted lines 12L of vibrating beam 12 illustrated in FIG. 1A. The plurality of coupling units 14 are provided in parallel while turned-down unit 13 is sandwiched therebetween, and coupling units 14 are adjacently disposed.

Figure 1B:
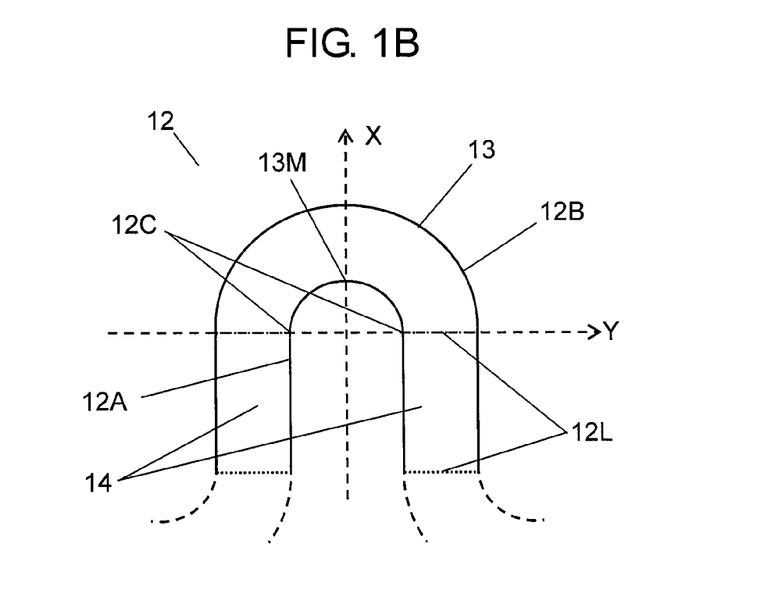
FIG. 1B is a partial plan view of a vibrating beam of the first embodiment.

FIG. 1B is a plan view of vibrating beam 12 of the first embodiment. In FIG. 1B, each of the plurality of turned-down shapes constituting the meandering shape includes inner circumference 12A and outer circumference 12B. A curvature of inner circumference 12A of the turned-down shape changes at each of the plurality of curvature changing points 12C, and turned-down unit 13 and coupling unit 14 are connected to each other at curvature changing point 12C.

The inner circumference of each of the plurality of turned-down units 13 has a constant curvature. Because of linear coupling unit 14, dotted line 12L indicating a boundary between turned-down unit 13 and coupling unit 14 is aligned with curvature changing point 12C. The inner circumference of each of the plurality of turned-down units 13 has midpoint 13M.

In the first embodiment, the inner circumference of turned-down unit 13 has the constant curvature, however, the present invention is not limited to this configuration. That is, the inner circumference of turned-down unit 13 does not necessarily have the constant curvature. For example, end portions of coupling unit 14, which are arranged in a line, may be connected by a straight line parallel to a Y-axis illustrated in FIG. 1A. In the first embodiment, coupling unit 14 has the linear shape, however, the present invention is not limited to this configuration. Alternatively, coupling unit 14 may have a curved shape.

Figure 1C:
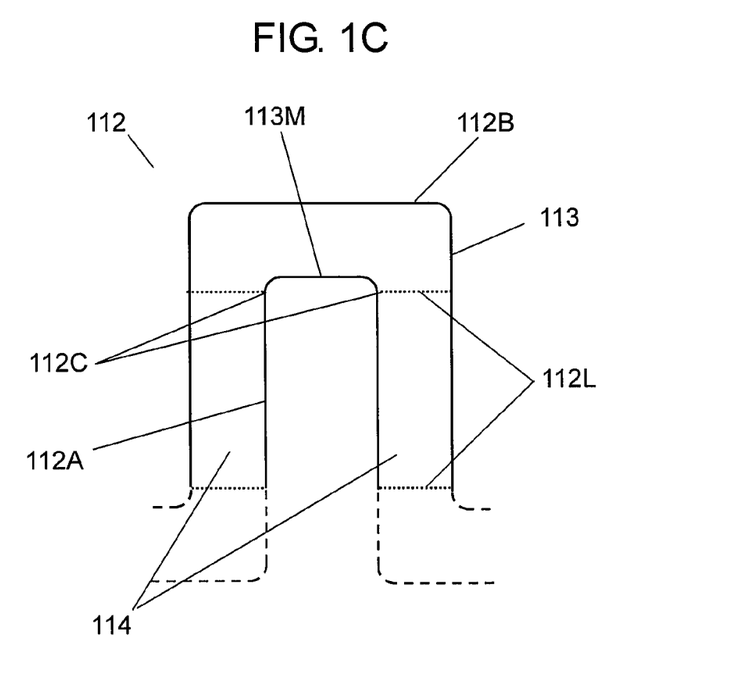
FIG. 1C is a partial plan view of a vibrating beam according to a modification of the first embodiment.

FIG. 1C is a partial plan view of vibrating beam 112 according to a modification of the first embodiment. In FIG. 1C, vibrating beam 112 according to the modification includes the plurality of turned-down units 113 and the plurality of coupling units 114. Turned-down unit 113 and the coupling units 114 adjacent to turned-down unit 113 constitute the turned-down shape. The inner circumference of the turned-down shape has curvature changing points 112C. Dotted line 112L that is the boundary between turned-down unit 113 and coupling unit 114 is aligned with curvature changing point 112C. Turned-down unit 113 may have a shape having the plurality of curvature changing points in addition to curvature changing point 112C in FIG. 1C. In this case, dotted line 112L may be aligned with any curvature changing point.

Figure 1D:
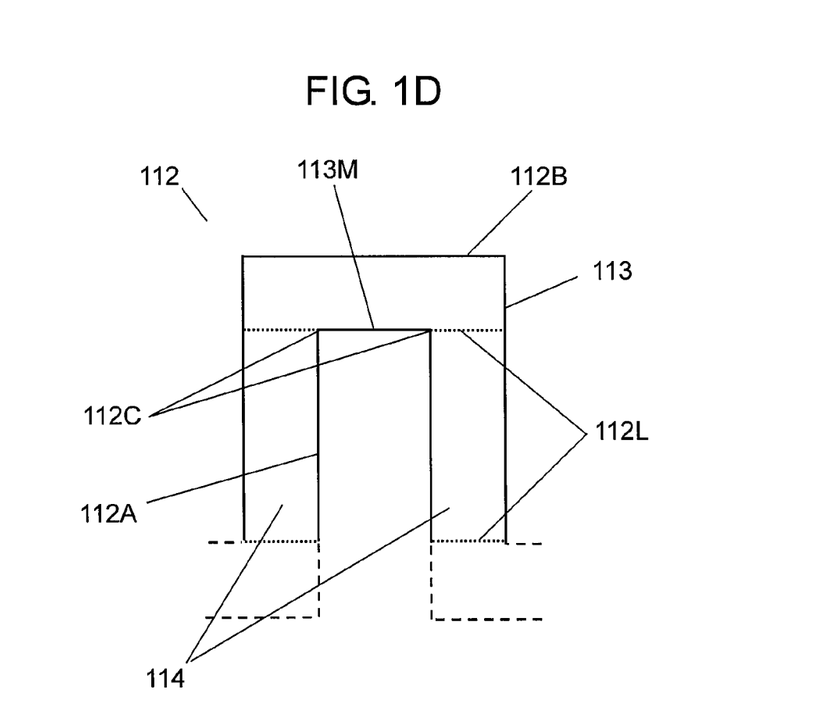
FIG. 1D is a partial plan view of a vibrating beam according to another modification of the first embodiment.

FIG. 1D is a partial plan view of vibrating beam 112 according to another modification of the first embodiment. As illustrated in FIG. 1D, an inner circumference or an outer circumference at a corner having the turned-down shape does not necessarily have an R (round) shape, but the coupling unit 114 and the turned-down unit 113 may form a right angle. In FIG. 1D, vibrating beam 112 according to another modification includes the plurality of turned-down units 113 and the plurality of coupling units 114 adjacent to turned-down units 113. Turned-down unit 113 and the coupling units 114 adjacent to turned-down unit 113 constitute the turned-down shape, and turned-down unit 113 and the coupling unit 114 are connected at the right angle. That is, the turned-down shape has curvature changing point 112C that changes from zero to infinity.

In any one of the above configurations, the present invention can be implemented. Hereinafter, a shape of vibrating beam 12 illustrated in FIG. 1B will typically be described.

A configuration of piezoelectric actuator 17 that drives vibrating element having the meandering shape 10 will be described in detail below.

Figure 2:
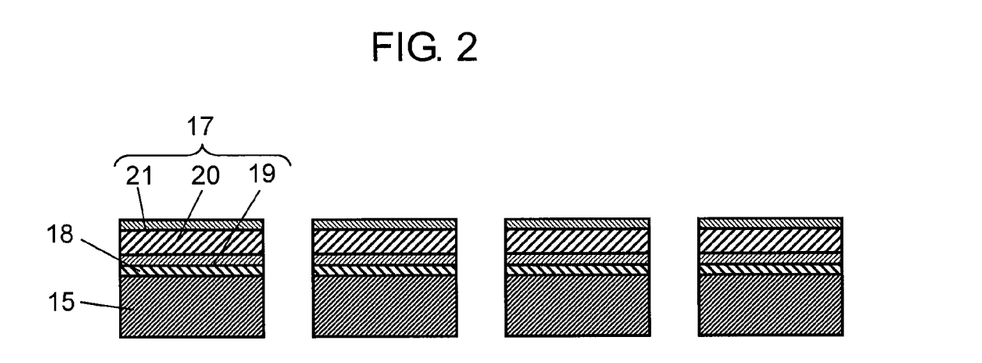
FIG. 2 is a sectional view taken along line 2-2 of the vibrating element having the meandering shape illustrated in FIG. 1A.

FIG. 2 is a sectional view taken along line 2-2 of vibrating element having the meandering shape 10 illustrated in FIG. 1A. Vibrating beam 12 includes silicon substrate 15 and insulating film 18 formed on silicon substrate 15. For example, insulating film 18 is formed by an oxide coating such as a silicon oxide film. Piezoelectric actuator 17 is formed on insulating film 18, and vibrating element having the meandering shape 10 includes common silicon substrate 15 as a lowermost layer. That is, insulating film 18 is formed on silicon substrate 15, and piezoelectric actuator 17 is provided on insulating film 18.

Piezoelectric actuator 17 includes lower electrode 19 provided on insulating film 18, piezoelectric film 20 stacked on lower electrode 19, and upper electrode 21 commonly stacked on piezoelectric film 20. Lower electrode 19 and upper electrode 21 are made of a conductor such as platinum and gold. Piezoelectric film 20 is made of a piezoelectric material such as lead zirconate titanate ($Pb(Zr_x,Ti_{1-x})O_3$, x=0.525). Lower electrode 19, upper electrode 21, and piezoelectric film 20 can be formed into a thin film by evaporation, a sol-gel method, CVD, and sputtering.

When a predetermined potential difference is provided between lower electrode 19 and upper electrode 21, a predetermined electric field is applied to piezoelectric film 20, and piezoelectric film 20 performs an expansion and contraction operation in parallel with an upper surface of vibrating beam 12 by an inverse piezoelectric effect. The expansion and contraction operation generates a vertical vibration of piezoelectric actuator 17, and therefore vibrating beam 12 vibrates vertically. Therefore, the plurality of coupling units 14 are displaced, and the displacement amount of coupling units 14 are superposed. As a result, one end of vibrating beam 12, which is not connected to and supported by fixed unit 11 is largely displaced with respect to the other end that is connected to and supported by fixed unit 11.

In the case that coupling unit 14 is sufficiently wide, upper electrodes 21 that apply the voltage of positive and negative phases to the plurality of coupling units 14 may alternately be provided. In the case that coupling unit 14 is narrow, common upper electrode 21 displaces the plurality of coupling units 14 in opposite directions to each other by alternately inverting polarization directions of piezoelectric film 20, whereby the displacements of coupling units 14 are superposed to achieve the large displacement. Piezoelectric actuator 17 of the first embodiment may have either the configuration in which coupling unit 14 is sufficiently wide or the configuration coupling unit 14 is narrow.

In the conventional vibrating element having the meandering shape, in order to increase the displacement of piezoelectric actuator 5, it is necessary that the large voltage be applied to the piezoelectric material to superpose flexing displacements of the meandering-shape coupling units. At this point due to a large stress applied to vibrating beam 12, unfortunately the electrode provided on the whole surface on the piezoelectric film generates stress migration to cause disconnection.

Particularly, a torsional stress is applied to a neighborhood at the midpoint of the inner circumference of the turned-down unit by the vertical vibration of the coupling unit, and a bending stress is applied to the neighborhood at the curvature changing point by bending deformation of the coupling unit. For this reason, unfortunately the particularly large stress is applied to the piezoelectric film or electrode, which is provided in the neighborhood at the midpoint of the inner circumference of the turned-down unit or the neighborhood at the curvature changing point, whereby the stress migration is generated to cause the disconnection.

In vibrating element having the meandering shape 10 of the first embodiment, a non-existence region where upper electrode 21 does not exist is provided at least at each of the plurality of midpoints 13M of the inner circumferences of turned-down units 13 and in the neighborhood of midpoint 13M or at each of the plurality of curvature changing points 12C at each of which the curvature of inner circumference 12A of the turned-down shape changes and in the neighborhood of curvature changing point 12C.

A configuration of vibrating element having the meandering shape 10 in which the non-existence region where upper electrode 21 does not exist is provided will be described below. In the first embodiment, the non-existence region where upper electrode 21 does not exist is referred to as an upper electrode removing region.

Figure 3:
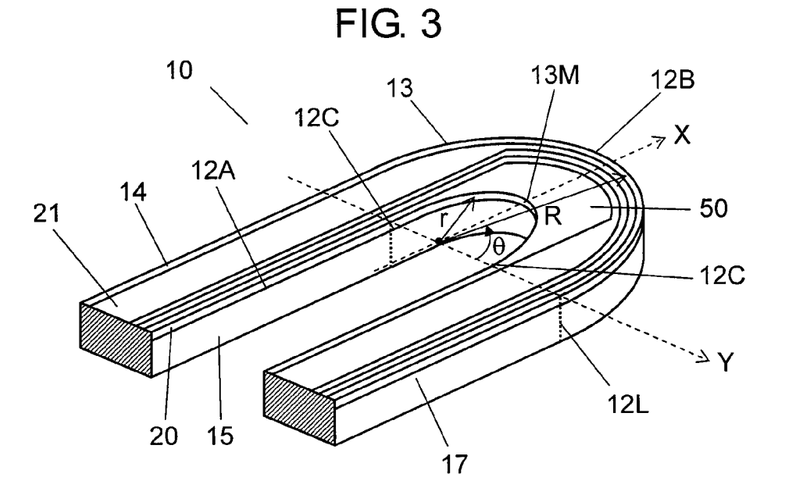
FIG. 3 is an enlarged perspective view illustrating a structure in which an upper electrode is removed at a midpoint of an inner circumference of a turned-down unit and in a neighborhood of the midpoint in the vibrating element having the meandering shape of the first embodiment.

FIG. 3 is an enlarged perspective view illustrating a structure in which upper electrode 21 at midpoint 13M of the inner circumference of turned-down unit 13 and in the neighborhood of midpoint 13M is removed in vibrating element having the meandering shape 10 of the first embodiment. The removal of upper electrode 21 at each of the plurality of midpoints 13M of the inner circumferences of turned-down units 13 and in the neighborhood of midpoint 13M will be described in detail with reference to FIG. 3.

In vibrating element having the meandering shape 10 in FIG. 3, upper electrode removing region 50 where upper electrode 21 is removed is provided at each of the plurality of midpoints 13M of the inner circumferences of turned-down units 13 and in the neighborhood of midpoint 13M. As illustrated in FIG. 3, in the first embodiment, it is assumed that a curvature center of the inner circumference of turned-down unit 13 is an origin of a plane formed by the X-axis and Y-axis. Radius r is an inner circumference radius of turned-down unit 13, and radius R is an outer circumference radius of turned-down unit 13. It is assumed that a point (r, 0) is midpoint 13M on the inner circumference of turned-down unit 13. Desirably, at least part of upper electrode removing region 50 is included in a region expressed by $0 < X \leq r+(R-r)/2$, and $r \leq Y \leq r$ (Formula 1)

in the XY-plane illustrated in FIG. 3.

When piezoelectric actuator 17 is driven to vibrate vibrating element having the meandering shape 10, the torsional stress is generated at midpoint 13M of turned-down unit 13 and in the neighborhood of midpoint 13M. In the case that upper electrode 21 is formed in upper electrode removing region 50, the torsional stress is largely applied to upper electrode 21 in upper electrode removing region 50. The large torsional stress can be prevented from being applied to upper electrode 21 by providing upper electrode removing region 50 where upper electrode 21 is not formed at midpoint 13M of turned-down unit 13 and in the neighborhood of midpoint 13M. Therefore, the disconnection of upper electrode 21 is eliminated at midpoint 13M of turned-down unit 13 and in the neighborhood of midpoint 13M.

In the first embodiment, the inner circumference of turned-down unit 13 has the curvature. However, a similar effect can be obtained even if the inner circumference of turned-down unit 13 is the straight line.

Alternatively, the outer circumference of turned-down unit 13 may be formed into the linear shape parallel to the Y-axis illustrated in FIG. 3. In this case, assuming that R is a distance from the origin to the outer circumference of turned-down unit 13, desirably at least part of upper electrode removing region 50 is included in the region expressed by formula 1.

Figure 4:
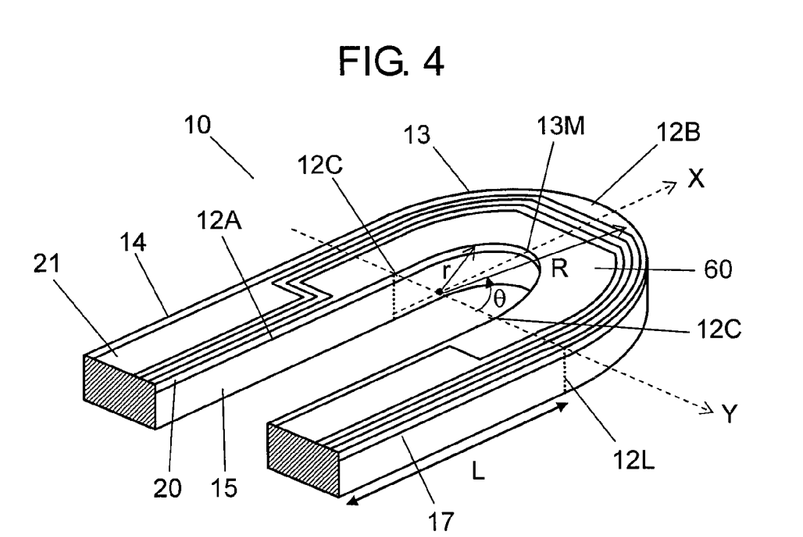
FIG. 4 is an enlarged perspective view illustrating a structure in which the upper electrode is removed at a curvature changing point of the inner circumference having a turned-down shape and in the neighborhood of the curvature changing point in the vibrating element having the meandering shape of the first embodiment.

FIG. 4 is an enlarged perspective view illustrating a structure in which upper electrode 21 is removed at each of the plurality of curvature changing points 12C of inner circumferences 12A of the turned-down shapes and in the neighborhood of curvature changing point 12A in vibrating element having the meandering shape 10 of the first embodiment. The removal of upper electrode 21 at each of the plurality of curvature changing points 12C of inner circumferences 12A of the turned-down shapes and in the neighborhood of curvature changing point 12C will be described in detail with reference to FIG. 4.

In vibrating element having the meandering shape 10 in FIG. 4, upper electrode removing region 60 where upper electrode 21 is removed is provided in each of the plurality of curvature changing points 12C of inner circumferences 12A of the turned-down shapes and in the neighborhood of curvature changing point 12C. Like the structure in FIG. 3, it is assumed that the origin is the curvature center of turned-down unit 13, that r is the inner circumference radius of turned-down unit 13, and that R is the outer circumference radius of turned-down unit 13. It is also assumed that θ is a rotation angle about the origin, and that L is a length of the coupling unit 14. Desirably at least one point (X, Y) in upper electrode removing region 60 is included in a region expressed by $-L/2 \leq X \leq \{r+(R-r)/2\} \cdot \sin\theta$ $(0 \leq \theta \leq \pi/4)$ $r \leq Y \leq r+(R-r)/2$ (Formula 2)

or $-L/2 \leq X \leq \{r+(R-r)/2\} \cdot \sin\theta$ $(3\pi/4 \leq \theta \leq \pi)$ $-r-(R-r)/2 \leq Y \leq -r$ (Formula 3).

When piezoelectric actuator 17 is driven to vibrate vibrating element having the meandering shape 10, the bending stress is generated by the bending deformation of coupling unit 14 in a periphery of a connection portion of turned-down unit 13 and coupling unit 14, namely, at curvature changing point 12C of inner circumference 12A and in the neighborhood of curvature changing point 12C. In the case that upper electrode 21 is formed in upper electrode removing region 60, the bending stress is largely applied to upper electrode 21 in upper electrode removing region 60. The large torsional stress can be prevented from being applied to upper electrode 21 by providing upper electrode removing region 60 where upper electrode 21 is not formed at curvature changing point 12C and in the neighborhood of curvature changing point 12C. Therefore, the disconnection of upper electrode 21 is eliminated at curvature changing point 12C of inner circumference 12A and in the neighborhood of curvature changing point 12C.

In the first embodiment, the inner circumference of turned-down unit 13 has the curvature. However, a similar effect can be obtained even if the inner circumference of turned-down unit 13 is the straight line.

Alternatively, the outer circumference of turned-down unit 13 may be formed into the linear shape parallel to the Y-axis illustrated in FIG. 4. In this case, assuming that R is a distance from the origin to the outer circumference of turned-down unit 13, desirably at least part of upper electrode removing region 60 is included in the region expressed by formula 2 or 3.

In the first embodiment, the region where upper electrode 21 is removed at each of the plurality of midpoints 13M of the inner circumferences of turned-down units 13 and in the neighborhood of midpoint 13M and the region where upper electrode 21 is removed at each of curvature changing points 12C of inner circumferences 12A of turned-down shapes and in the neighborhood of curvature changing point 12C are separately described. Alternatively, both the regions may be provided.

It is not necessary to provide upper electrode removing region 50 or upper electrode removing region 60 at all midpoints 13M or curvature changing points 12C, but upper electrode removing region 50 or upper electrode removing region 60 may be provided some of the plurality of midpoints 13M or curvature changing points 12C.

In the case that upper electrode removing region 50 or 60 is provided in turned-down unit 13, desirably upper electrode 21 is provided nearer outer circumference 12B in turned-down unit 13.

In the first embodiment, part of upper electrode 21 is removed by providing upper electrode removing region 50 or upper electrode removing region 60, an electrode area becomes smaller than that of the conventional structure in which upper electrode 21 is not removed. That is, because a total of electric fields applied to piezoelectric film 20 decreases, driving efficiency of piezoelectric actuator 17 is degraded. However, in the case that upper electrode 21 is provided over the whole upper surface of piezoelectric film 20, the large stress is applied to upper electrode 21 to generate the stress migration, and upper electrode 21 is disconnected to disable piezoelectric actuator 17. Therefore, highly effectively upper electrode 21 to which the particularly large stress is applied is removed at midpoint 13M of turned-down unit 13 and in the neighborhood of midpoint 13M or at curvature changing point 12C of the turned-down shape and in the neighborhood of curvature changing point 12C.

Figure 5:
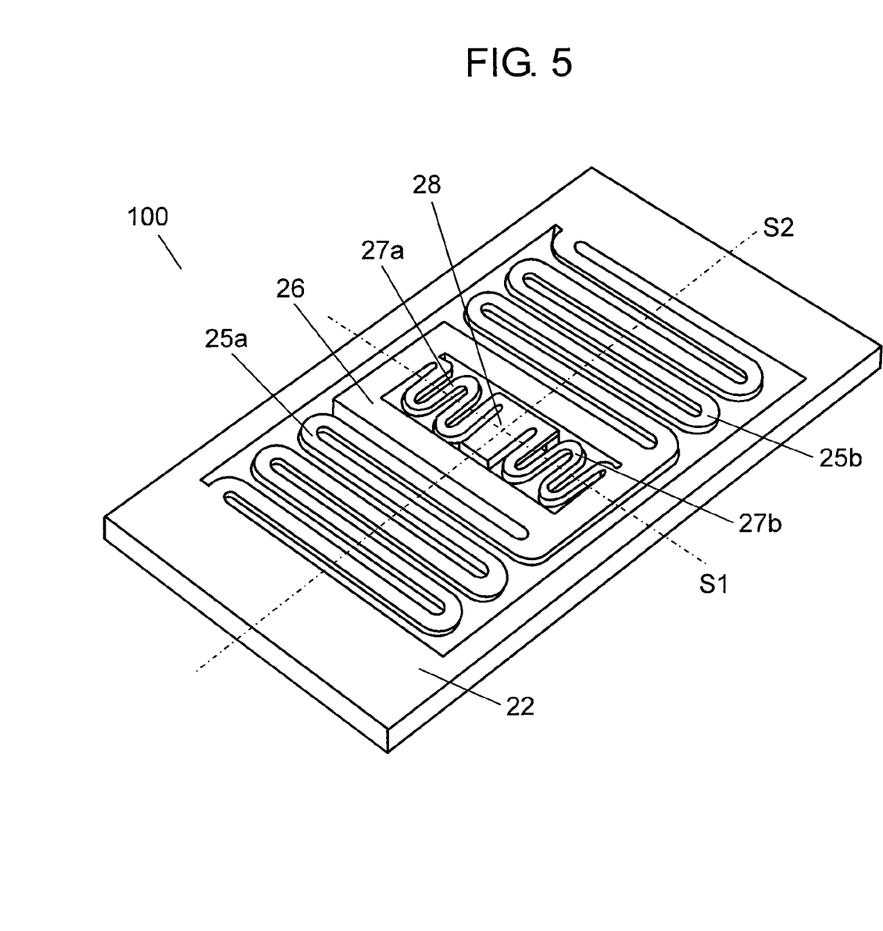
FIG. 5 is a perspective view of an optical reflection element in which the vibrating element having the meandering shape of the first embodiment is used.

FIG. 5 is a perspective view of optical reflection element 100 in which vibrating element having the meandering shape 10 of the first embodiment is used. In FIG. 5, optical reflection element 100 includes fixed frame 22, a pair of first vibrating units 25a and 25b, turnable movable frame 26, a pair of second vibrating units 27a and 27b, and turnable mirror unit 28. One end of each of first vibrating units 25a and 25b is connected to the inside of fixed frame 22. Movable frame 26 is turnably connected to and supported by the other end of each of first vibrating units 25a and 25b. One end of each of second vibrating units 27a and 27b is connected to the inside of movable frame 26. The pair of first vibrating units 25a and 25b and the pair of second vibrating units 27a and 27b are disposed such that turning axes are substantially orthogonal to each other. Mirror unit 28 is turnably connected to and supported by the other end of each of the pair of second vibrating units 27a and 27b. In the optical reflection element 100, vibrating element having a meandering shape 10 can be applied to the pair of first vibrating units 25a and 25b or the pair of second vibrating units 27a and 27b.

In FIG. 5, axis S1 extends along the pair of first vibrating units 25a and 25b through the substantial center of mirror unit 28, and axis S2 extends along the pair of second vibrating units 27a and 27b through the substantial center of mirror unit 28. Movable frame 26 turns about axis S2, and mirror unit 28 turns about axis S1. In optical reflection element 100, mirror unit 28 is irradiated with a luminous flux (a light spot) by turning movable frame 26 and mirror unit 28, and a screen is scanned with the reflected luminous flux in the directions of axes S1 and S2, which allows an image to be projected onto the screen.

Note that, after upper electrode 21 is formed, upper electrode removing regions 50 and 60 are provided by removing upper electrode 21. Alternatively, in forming upper electrode 21, upper electrode removing regions may be provided as a region where upper electrode 21 is not formed.

Second Exemplary Embodiment

Vibrating element having a meandering shape 30 according to a second embodiment will be described with reference to the drawings. Note that, the same configuration as the first embodiment is designated by the same numeral.

Figure 6:
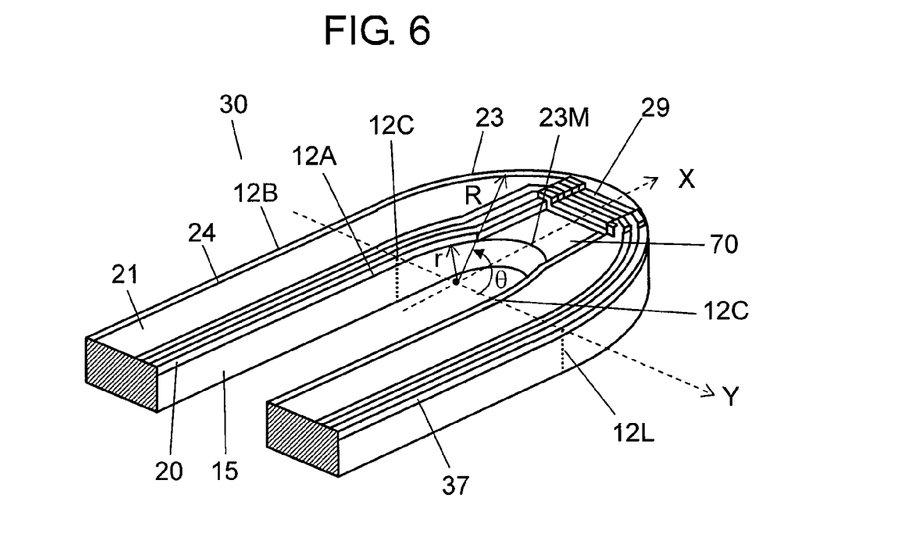
FIG. 6 is an enlarged perspective view illustrating a structure in which a piezoelectric film is removed at a midpoint of an inner circumference of a turned-down unit and in the neighborhood of the midpoint in a vibrating element having a meandering shape according to a second embodiment.

FIG. 6 is an enlarged perspective view illustrating a structure in which piezoelectric film 20 is removed at midpoint 23M of an inner circumference of turned-down unit 23 and in the neighborhood of midpoint 23M in vibrating element having the meandering shape 30 of the second embodiment.

Vibrating element having the meandering shape 30 of the second embodiment includes the plurality of turned-down units 23, the plurality of coupling units 24, and piezoelectric actuator 37 instead of the plurality of turned-down unit 13, the plurality of coupling units 14, and piezoelectric actuator 17 of vibrating element having the meandering shape 10 of the first embodiment illustrated in FIG. 1. That is, while vibrating element having the meandering shape 10 of the first embodiment includes the region where the upper electrode does not exist in the plurality of turned-down units 13 or the plurality of coupling units 14, vibrating element having the meandering shape 30 of the second embodiment includes the region where the piezoelectric film does not exist in the plurality of turned-down unit 23 or the plurality of coupling units 24. The descriptions of the basic configuration and the driving principle of piezoelectric actuator 37, which are similar to those of the first embodiment, are omitted.

In vibrating element having the meandering shape 30, a non-existence region where piezoelectric film 20 does not exist is provided at least at each of the plurality of midpoints 23M of the inner circumferences of turned-down units 23 and in the neighborhood of midpoint 23M or at each of the plurality of curvature changing points 12C at each of which the curvature of inner circumference 12A of the turned-down shape changes and in the neighborhood of curvature changing point 12C. In the second embodiment, the non-existence region where piezoelectric film 20 does not exist is referred to as a piezoelectric film removing region.

The removal of piezoelectric film 20 at each of the plurality of midpoints 23M of the inner circumferences of turned-down units 23 and in the neighborhood of midpoint 23M will be described in detail with reference to FIG. 6.

A vibrating beam includes the plurality of turned-down units 23 having curvatures and the plurality of coupling units 24 each of which is coupled to the turned-down units 23.

Turned-down unit 23 of the present embodiment has the curvature. Alternatively, for example, the end portions of parallel coupling units 24 may be connected by a straight line parallel to the Y-axis illustrated in FIG. 6.

In FIG. 6, it is assumed that the curvature center of turned-down unit 23 is the origin of the plane formed by the X-axis and Y-axis, that radius r is the inner circumference radius of turned-down unit 23, and that radius R is the outer circumference radius of turned-down unit 23. It is assumed that the point (r, 0) is midpoint 23M on the inner circumference of turned-down unit 23. Desirably at least one point (X, Y) in piezoelectric film removing region 70 where piezoelectric film 20 is removed is included in a region expressed by $$0 < X \leq R$$

$$-r \leq Y \leq r \quad \text{(Formula 4)}.$$

When piezoelectric actuator 37 is driven to vibrate vibrating element having the meandering shape 30, the torsional stress is generated at midpoint 23M of turned-down unit 23 and in the neighborhood of midpoint 23M. In the case that piezoelectric film 20 is formed in piezoelectric film removing region 70, the torsional stress is largely applied to piezoelectric film 20 of piezoelectric film removing region 70. The large torsional stress can be prevented from being applied to piezoelectric film 20 by providing piezoelectric film removing region 70 where piezoelectric film 20 is not formed at midpoint 23M of turned-down unit 23 and in the neighborhood of midpoint 23M.

The removal of piezoelectric film 20 possibly causes upper electrode 21 and lower electrode 19 in piezoelectric film removing region 70 to come into contact with each other and short out. Therefore, insulator 29 is provided in piezoelectric film removing region 70 to form upper electrode 21 on the upper surface of insulator 29, which allows the short circuit to be avoided between upper electrode 21 and lower electrode 19.

Insulator 29 is made of an insulating material such as a resin and an oxide film. Insulator 29 can be formed into a thin film by evaporation, a sol-gel method, CVD, and sputtering.

Because the resin has stiffness smaller than that of piezoelectric film 20, the stress generated by the torsional deformation of silicon substrate 15 that is the diaphragm can be relaxed when the resin is used as the material for insulator 29. Therefore, the stress applied to upper electrode 21 formed on insulator 29 can be decreased to effectively suppress the stress migration of upper electrode 21.

The region where insulator 29 is formed may be provided in whole piezoelectric film removing region 70. From the viewpoint of decreasing an influence of the torsional stress on insulator 29, desirably the region is provided on the outer circumference side of turned-down unit 23 as much as possible. Particularly, in the case that the oxide film is used as the material for insulator 29, because the oxide film has the high film stress, desirably the region is provided on the outer circumference side of turned-down unit 23 as much as possible.

In the second embodiment, the inner circumference of turned-down unit 23 has the curvature. However, the similar effect can be obtained even if the inner circumference of turned-down unit 23 is the straight line.

Alternatively, the outer circumference of turned-down unit 23 may be formed into the linear shape parallel to the Y-axis. In this case, assuming that R is the distance from the origin to the outer circumference of turned-down unit 23, desirably at least part of piezoelectric film removing region 70 where piezoelectric film 20 is removed is included in the region expressed by formula 4.

Figure 7:
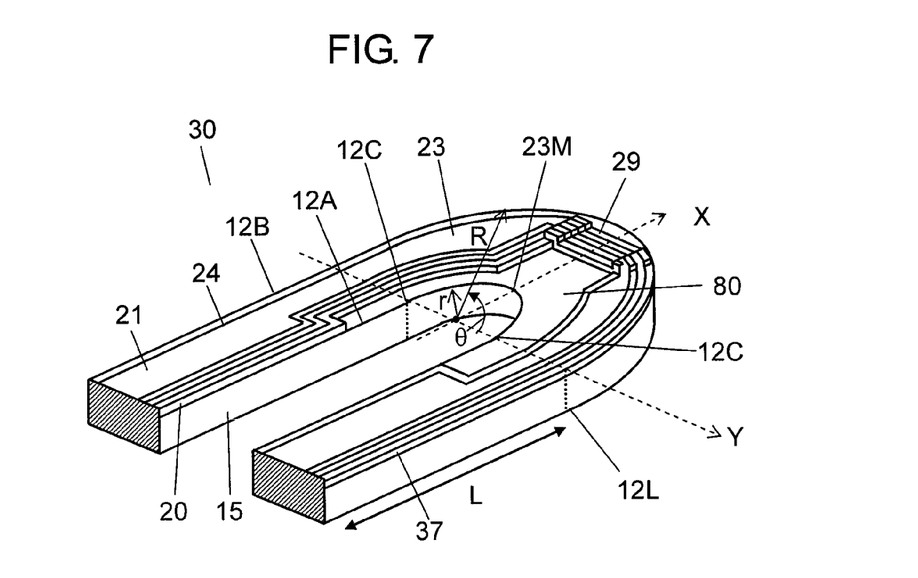
FIG. 7 is an enlarged perspective view illustrating a structure in which the piezoelectric film is removed at the curvature changing point of the inner circumference having a turned-down shape and in the neighborhood of the curvature changing point in the vibrating element having the meandering shape of the second embodiment.

FIG. 7 is an enlarged perspective view illustrating a structure in which piezoelectric film 20 is removed at curvature changing point 12C of inner circumference 12A of the turned-down shape and in the neighborhood of curvature changing point 12C in the vibrating element having the meandering shape 30 of the second embodiment. The removal of piezoelectric film 20 at each of the plurality of curvature changing points 12C of inner circumferences 12A of the turned-down shapes and in the neighborhood of curvature changing point 12C will be described in detail with reference to FIG. 7.

In vibrating element having the meandering shape 30 in FIG. 7, piezoelectric film removing region 80 where piezoelectric film 20 is removed is provided in each of the plurality of curvature changing points 12C of inner circumferences 12A of the turned-down shapes and in the neighborhood of curvature changing point 12C. Like the structure in FIG. 6, it is assumed that the origin is the curvature center of turned-down unit 23, that r is the inner circumference radius of turned-down unit 23, and that R is the outer circumference radius of turned-down unit 23. It is also assumed that θ is the rotation angle about the origin, and that L is the length of the coupling unit 24. Desirably at least one point (X, Y) in piezoelectric film removing region 80 is included in a region expressed by $$-L < X \leq R \cdot \sin\theta$$

$$(0 \leq \theta \leq \pi/4)$$

$$r \leq Y \leq r(R-r)/2 \quad \text{(Formula 5)}$$

or $$-L < X \leq R \cdot \sin\theta$$

$$(3\pi/4 \leq \theta \leq \pi)$$

$$-r-(R-r)/2 \leq Y \leq -r \quad \text{(Formula 6)}.$$

When piezoelectric actuator 37 is driven to vibrate vibrating element having the meandering shape 30, the bending stress is generated by the bending deformation of coupling unit 24 in the neighborhood of the connection portion of turned-down unit 23 and coupling unit 24, namely, at curvature changing point 12C of inner circumference 12A and in the neighborhood of the curvature changing point 12C. In the case that piezoelectric film 20 is formed in piezoelectric film removing region 80, the bending stress is largely applied to piezoelectric film 20 of piezoelectric film removing region 80. The large bending stress can be prevented from being applied to piezoelectric film 20 by providing piezoelectric film removing region 80 where piezoelectric film 20 is not formed at curvature changing point 12C and in the neighborhood of curvature changing point 12C.

The removal of piezoelectric film 20 possibly causes upper electrode 21 and lower electrode 19 in piezoelectric film removing region 80 to come into contact with each other and short out. Therefore, insulator 29 is provided in piezoelectric film removing region 80 where piezoelectric film 20 is removed, which allows the short circuit to be avoided between upper electrode 21 and lower electrode 19. The material for insulator 29 and preferred embodiment are already described.

In the second embodiment, the inner circumference of turned-down unit 23 has the curvature. However, the similar effect can be obtained even if the inner circumference of turned-down unit 23 is the straight line.

Alternatively, the outer circumference of turned-down unit 23 may be formed into the linear shape parallel to the Y-axis illustrated in FIG. 7. In this case, assuming that R is the distance from the origin to the outer circumference of turned-down unit 23, desirably at least part of piezoelectric film removing region 80 is included in the region expressed by formula 5 or 6.

In the second embodiment, the region where piezoelectric film 20 is removed at each of the plurality of midpoints 23M of the inner circumferences of turned-down units 23 and in the neighborhood of midpoint 23M and the region where piezoelectric film 20 is removed at each of curvature changing points 12C of turned-down shapes and in the neighborhood of curvature changing point 12C are separately described. Alternatively, both the regions may be provided.

It is not necessary to provide upper electrode removing region 70 or upper electrode removing region 80 at all midpoints 23M or curvature changing points 12C, but upper electrode removing region 70 or upper electrode removing region 80 may be provided some of the plurality of midpoints 23M or curvature changing points 12C.

In the second embodiment, because piezoelectric film 20 is partially removed by providing piezoelectric film removing region 70 or piezoelectric film removing region 80, a force propagating to vibrating beam 12 is weakened compared with the conventional structure in which piezoelectric film 20 is not removed. Therefore, the driving efficiency of piezoelectric actuator 37 is degraded. However, in the case that upper electrode 21 is provided over the whole upper surface of piezoelectric film 20, piezoelectric film 20 applies the large stress to upper electrode 21 to generate the stress migration, and upper electrode 21 is disconnected to disable piezoelectric actuator 37. Therefore, highly effectively piezoelectric film 20 is removed in the region to which the large stress is applied to provide upper electrode 21 on insulator 29.

Like that of the first embodiment, vibrating element having the meandering shape 30 can be applied to the optical reflection element illustrated in FIG. 5.

Note that, after piezoelectric film 20 is formed, upper electrode removing regions 70 and 80 are provided by removing piezoelectric film 20. Alternatively, in forming piezoelectric film 20, upper electrode removing regions 70 and 80 may be provided as a region where piezoelectric film 20 is not formed.

Third Exemplary Embodiment

Vibrating element having a meandering shape 40 according to a third embodiment will be described with reference to the drawing. Note that, the same configuration as the first and second embodiments is designated by the same numeral.

Figure 8:
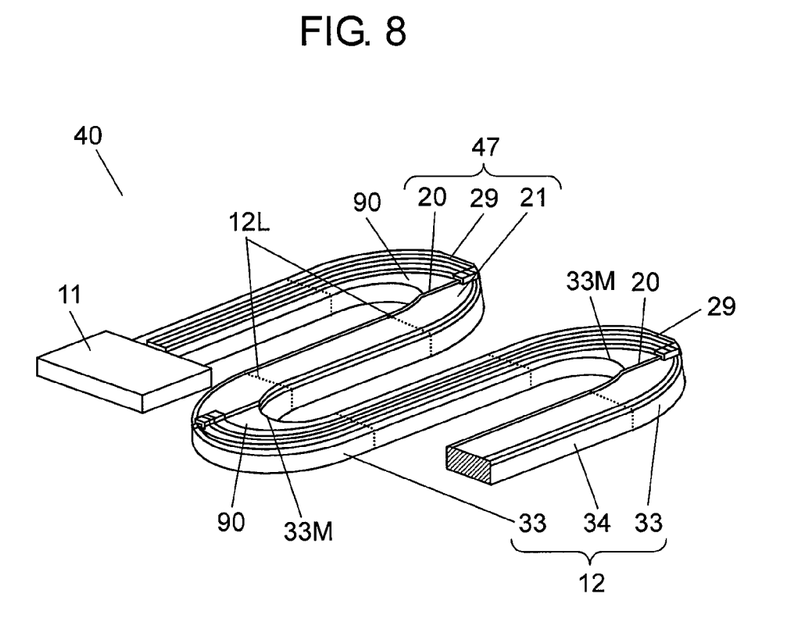
FIG. 8 is an enlarged perspective view illustrating a structure in which the piezoelectric films are alternately provided with respect to coupling units adjacent to each other in a vibrating element having a meandering shape according to a third embodiment.

FIG. 8 is an enlarged perspective view illustrating a structure in which piezoelectric films 20 are alternately provided with respect to coupling units 34 adjacent to each other in vibrating element having the meandering shape 40 of the third embodiment.

Vibrating element having the meandering shape 40 of the third embodiment includes the plurality of turned-down units 33, the plurality of coupling units 34, and piezoelectric actuator 47 instead of the plurality of turned-down unit 13, the plurality of coupling units 14, and piezoelectric actuator 17 of vibrating element having the meandering shape 10 of the first embodiment illustrated in FIG. 1. That is, while vibrating element having the meandering shape 10 of the first embodiment includes the region where the upper electrode does not exist in the plurality of turned-down units 13 or the plurality of coupling units 14, vibrating element having the meandering shape 40 of the third embodiment includes the region where the piezoelectric films does not alternately exist in the plurality of coupling units 34. The descriptions of the basic configuration and the driving principle of piezoelectric actuator 47, which are similar to those of the first embodiment, are omitted. In vibrating element having the meandering shape 40, piezoelectric films 20 are alternately provided with respect to the plurality of coupling units 34. That is, piezoelectric films 20 are alternately removed with respect to the plurality of coupling units 34.

The structure in which piezoelectric films 20 are alternately provided with respect to coupling units 34 adjacent to each other will be described in detail with reference to FIG. 8.

In FIG. 8, vibrating beam 12 includes the plurality of turned-down units 33 having curvatures and the plurality of coupling units 34 each of which is coupled to the turned-down units 33. Coupling units 34 is the linear part of vibrating beam 12, and sandwiched between dotted lines 12L of vibrating beam 12 illustrated in FIG. 8.

Turned-down unit 33 of the third embodiment has the curvature. Alternatively, for example, as illustrated in FIG. 1C, the end portions of parallel coupling units 34 may be connected by the straight line parallel to the Y-axis illustrated in FIG. 1A.

Piezoelectric films 20 are configured to be alternately disposed with respect to coupling units 34, which are adjacent to each other while turned-down unit 33 is sandwiched therebetween. In the configuration as described above, when the displacement amounts of the plurality of coupling units 34 are superposed, the in-phase voltages may alternately be applied to the plurality of coupling units 34. In this case, desirably the polarization directions of piezoelectric films 20 are aligned to the same direction.

In the configuration of the third embodiment, desirably piezoelectric film 20 is provided on the whole upper surface of coupling unit 34, and turned-down unit 33 has at least one of the configurations of the first and second embodiments.

When piezoelectric actuator 47 is driven, the torsional stress is generated at midpoint 33M of turned-down unit 33 and in the neighborhood of midpoint 33M. The bending stress is generated in the connection portion of turned-down unit 33 and coupling unit 34, namely, at curvature changing point 12C of inner circumference 12A or outer circumference 12B of the meandering shape and in the neighborhood of curvature changing point 12C. Because the large torsional stress or bending stress is applied to upper electrode 21 provided on piezoelectric film 20, desirably turned-down unit 33 has at least one of the configurations of the first and second embodiments.

Like turned-down unit 33, the stress is applied by the bending stress of piezoelectric actuator 47 to the upper electrode 21 formed on coupling unit 34, and the stress migration is generated. Therefore, upper electrode 21 is disconnected to disable piezoelectric actuator 47.

In the third embodiment, piezoelectric films 20 are alternately provided with respect to the plurality of parallel coupling units 34 adjacent to each other. That is, piezoelectric film removing regions 90 where piezoelectric films 20 are alternately removed are provided with respect to the plurality of parallel coupling units 34 adjacent to each other. In piezoelectric film removing region 90 where piezoelectric film 20 is removed, piezoelectric film 20 possibly causes upper electrode 21 and lower electrode 19 to come into contact with each other and short out. Therefore, the short circuit can be avoided between upper electrode 21 and lower electrode 19 by providing insulator 29 in piezoelectric film removing region 90.

The material and characteristic of insulator 29 are similar to those of the second embodiment. The region where insulator 29 is formed may be provided in whole piezoelectric film removing region 90. From the viewpoint of decreasing the influence of the torsional stress on insulator 29, desirably the region is provided on the outer circumference side of turned-down unit 33 as much as possible. Particularly, in the case that the oxide film is used as the material for insulator 29, because the oxide film has the high film stress, desirably the region is provided on the outer circumference side of turned-down unit 33 as much as possible.

Alternatively, the outer circumference of turned-down unit 33 may be formed into the linear shape parallel to the Y-axis.

When vibrating element having the meandering shape 40 is formed so as to have the configuration similar to that of the first embodiment illustrated in FIG. 5, vibrating element having the meandering shape 40 can be applied to optical reflection element 100. In this case, desirably piezoelectric film 20 is provided on coupling unit 34 that is adjacent to mirror unit 28 and movable frame 26. This is because the driving efficiency of piezoelectric actuator 47 is significantly degraded when piezoelectric film 20 is not provided on coupling unit 34 that is adjacent to mirror unit 28 and movable frame 26.

In the third embodiment, the stress migration of upper electrode 21 on coupling unit 34 is suppressed by providing piezoelectric film removing region 90 on coupling unit 34, however the present invention is not limited to this configuration.

Alternatively, for example, when the region where upper electrode 21 is removed is provided on coupling unit 34, the stress migration of upper electrode 21 can be suppressed like the case that piezoelectric film removing region 90 is provided. For example, both the piezoelectric film removing region 90 and the region where upper electrode 21 is removed may be provided on coupling unit 34.

INDUSTRIAL APPLICABILITY

The vibrating element having a meandering shape can provide the optical reflection element that is largely displaced without disconnecting the upper electrode, and be used in a small-size projector and a head-mounted display.

What is claimed is:
1. A meandering-shaped vibrating element comprising:
a vibrating beam having a meandering shape including:
a plurality of turning portions, and
a plurality of coupling portions having straight shapes that are parallel with each other and are coupled to the plurality of turning portions such that the coupling portions and the plurality of turning portions are connected alternately; and
a piezoelectric actuator including:
a lower electrode provided on the vibrating beam,
a piezoelectric film provided on the lower electrode, and
an upper electrode provided on the piezoelectric film,
wherein each one turning portion out of the plurality of turning portions and respective pair of coupling portions out of the plurality of coupling portions connected to the each one turning portion substantially form a U-shape having an inner circumference and an outer circumference,
wherein each of the plurality of turning portions includes a non-existence region where the upper electrode does not exist and an existence region where the upper electrode exists,
wherein the non-existence region includes the inner circumference of the U-shape, and is located away from the outer circumference of the U-shape, and
wherein the existence region is closer to the outer circumference of the U-shape than the non-existence region.

2. The meandering-shaped vibrating element according to claim 1,
wherein each of the plurality of coupling portions and each of the plurality of turning portions are connected at a right angle.

3. The meandering-shaped vibrating element according to claim 1,
wherein the piezoelectric film does not exist in alternate ones of the plurality of coupling portions.

4. An optical reflection element comprising:
the meandering-shaped vibrating element according to claim 3;
a fixed unit to which one end of the meandering-shaped vibrating element is connected; and
a mirror unit that is turned by the meandering-shaped vibrating element.

5. The meandering-shaped vibrating element according to claim 1, wherein the non-existence region of each of the plurality of turning portions includes a curvature changing point at which a curvature of the inner circumference of the U-shape changes.

6. The meandering-shaped vibrating element according to claim 5, wherein
each of the plurality of turning portions and each of the plurality of coupling portions are connected at a curvature changing point.

7. The meandering-shaped vibrating element according to claim 1,
wherein the piezoelectric film has a surface having the upper electrode thereon, and
wherein the surface of the piezoelectric film includes a portion located in the non-existence region of each of the plurality of turning portions.

8. The meandering-shaped vibrating element according to claim 7, wherein
each of the plurality of turning portions and each of the plurality of coupling portions are connected at a curvature changing point.

9. A meandering-shaped vibrating element comprising:
a vibrating beam having a meandering shape including:
a plurality of turning portions, and
a plurality of coupling portions having straight shapes that are parallel with each other and are coupled to the plurality of turning portions such that the coupling portions and the plurality of turning portions are connected alternately; and
a piezoelectric actuator including:
a lower electrode provided on the vibrating beam,
a piezoelectric film provided on the lower electrode, and
an upper electrode provided on the piezoelectric film,
wherein each one turning portion out of the plurality of turning portions and respective pair of coupling portions of the plurality of coupling portions connected to the each one turning portion substantially form a U-shape having an inner circumference and an outer circumference, wherein each of the plurality of turning portions includes a non-existence region where the piezoelectric film does not exist and an existence region where the piezoelectric film exists, wherein the non-existence region includes the inner circumference of the U-shape, and is located away from the outer circumference of the U-shape, and wherein the existence region is closer to the outer circumference of the U-shape than the non-existence region.

10. The meandering-shaped vibrating element according to claim 9, wherein the upper electrode does not exist in the non-existence region.

11. The meandering-shaped vibrating element according to claim 9, wherein each of the plurality of coupling portions and each of the plurality of turning portions are connected at a right angle.

12. The meandering-shaped vibrating element to claim 9, wherein the piezoelectric film does not exist in alternate ones of the plurality of coupling portions.

13. An optical reflection element comprising:

the meandering-shaped vibrating element according to claim 12;

a fixed unit to which one end of the meandering-shaped vibrating element is connected; and a mirror unit that is turned by the meandering-shaped vibrating element.

14. The meandering-shaped vibrating element according to claim 9, wherein the non-existence region of each of the plurality of turning portions includes a curvature changing point at which a curvature of the inner circumference of the U-shape changes.

* * * * *